United States Patent
Yagishita

(10) Patent No.: US 12,199,631 B2
(45) Date of Patent: Jan. 14, 2025

(54) COMPARATOR AND ANALOG TO DIGITAL CONVERTER

(71) Applicant: SONY SEMICONDUCTOR SOLUTIONS CORPORATION, Kanagawa (JP)

(72) Inventor: Yuki Yagishita, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 149 days.

(21) Appl. No.: 17/906,549

(22) PCT Filed: Mar. 23, 2021

(86) PCT No.: PCT/JP2021/012086
§ 371 (c)(1),
(2) Date: Sep. 16, 2022

(87) PCT Pub. No.: WO2021/200415
PCT Pub. Date: Oct. 7, 2021

(65) Prior Publication Data
US 2023/0163777 A1     May 25, 2023

(30) Foreign Application Priority Data
Mar. 30, 2020   (JP) ................... 2020-061390

(51) Int. Cl.
*H03M 1/00* (2006.01)
*H03M 1/12* (2006.01)
(Continued)

(52) U.S. Cl.
CPC ........... *H03M 1/38* (2013.01); *H03M 1/1245* (2013.01); *H03M 1/662* (2013.01)

(58) Field of Classification Search
CPC ....... H03M 1/38; H03M 1/1245; H03M 1/662
(Continued)

(56) References Cited

U.S. PATENT DOCUMENTS 7,088,191 B2*  8/2006  Paillet .................. H03K 3/0322
                                                                327/161
7,250,813 B1    7/2007  Yao

FOREIGN PATENT DOCUMENTS

JP    2013-187695 A    9/2013
JP    2017-163547 A    9/2017
(Continued)

OTHER PUBLICATIONS

International Search Report and Written Opinion of PCT Application No. PCT/JP2021/012086, issued on May 25, 2021, 08 pages of ISRWO.

(Continued)

*Primary Examiner* — Peguy Jean Pierre
(74) *Attorney, Agent, or Firm* — CHIP LAW GROUP

(57) ABSTRACT

To prevent occurrence of an input voltage dependent error due to an input parasitic capacitance. A comparator includes: a first transistor and a second transistor that include two sources connected to each other, two gates to which a differential input signal pair are input, and two drains that output a differential output signal pair corresponding to a difference signal of the differential input signal pair; a third transistor that is connected between both the sources of the first transistor and the second transistor and a first reference voltage node, the third transistor being switched on or off in accordance with logic of a first signal; and a fourth transistor that is connected between both the sources of the first transistor and the second transistor and a second reference voltage node, the fourth transistor being switched on or off (Continued)

in accordance with logic of a second signal having logic different from the logic of the first signal.

13 Claims, 11 Drawing Sheets

(51) Int. Cl.
    *H03M 1/38*     (2006.01)
    *H03M 1/66*     (2006.01)

(58) Field of Classification Search
    USPC ........................................ 341/126, 144, 155
    See application file for complete search history.

(56)               References Cited

FOREIGN PATENT DOCUMENTS

WO     2012/176250 A1    12/2012
WO     2018/216677 A1    11/2018

OTHER PUBLICATIONS

Schinkel, et al., "A Double-Tail Latch-Type Voltage Sense Amplifier with 18ps Setup+Hold Time", ISSCC 2007, Session 17, Analog Techniques and PLLs, 17.7, IEEE International Solid-State Circuits Conference, Feb. 13, 2007, 03 pages.

* cited by examiner

COMPARATOR AND ANALOG TO DIGITAL CONVERTER

CROSS REFERENCE TO RELATED APPLICATIONS

This application is a U.S. National Phase of International Patent Application No. PCT/JP2021/012086 filed on Mar. 23, 2021, which claims priority benefit of Japanese Patent Application No. JP 2020-061390 filed in the Japan Patent Office on Mar. 30, 2020. Each of the above-referenced applications is hereby incorporated herein by reference in its entirety.

TECHNICAL FIELD

The present disclosure relates to a comparator and an analog to digital converter.

BACKGROUND ART

A double-tail latch-type comparator has been proposed (see Non-Patent Document 1). In the double-tail latch-type comparator, a transistor that is switched on or off in accordance with logic of a clock signal is provided on a source side of a pair of transistors to which a differential input signal pair are input, a latch circuit is connected to a drain side of the pair of transistors described above, and another transistor that switches whether or not to perform a latch operation in accordance with logic of the clock signal is provided on one end side of the latch circuit.

CITATION LIST

Non-Patent Document

Non-Patent Document 1: "A Double-Tail Latch-Type Voltage Sense Amplifier with 18 ps Setup+Hold Time" (ISSCC 2007, 17.7)

SUMMARY OF THE INVENTION

Problems to be Solved by the Invention

In a case where the double-tail latch-type comparator is used in a successive approximation type analog to digital converter (hereinafter, ADC), the transistor on the source side of the pair of transistors in a comparator is off while the differential input signal pair are sampled. Accordingly, a potential of a source side path becomes an unstable state, so that the sampled differential input signal pair are affected by a parasitic capacitance of the path through which the sampled differential input node pair are input, thereby an input voltage dependent error occurs in the differential input node pair of the comparator. This error adversely affects the comparator when the comparator performs a comparison operation thereafter, and becomes a factor that reduces accuracy of the ADC.

Therefore, the present disclosure provides a comparator and an analog to digital converter that prevent occurrence of an input voltage dependent error due to an input parasitic capacitance.

Solutions to Problems

In order to solve the problems described above, according to the present disclosure, there is provided a comparator including: a first transistor and a second transistor that include two sources connected to each other, two gates to which a differential input signal pair are input, and two drains that output a differential output signal pair corresponding to a difference signal of the differential input signal pair;

a third transistor that is connected between both the sources of the first transistor and the second transistor and a first reference voltage node, the third transistor being switched on or off in accordance with logic of a first signal; and a fourth transistor that is connected between both the sources of the first transistor and the second transistor and a second reference voltage node, the fourth transistor being switched on or off in accordance with logic of a second signal having logic different from the logic of the first signal.

The fourth transistor may be turned on in a period in which the first transistor and the second transistor do not perform a comparison operation of the difference signal of the differential input signal pair.

The third transistor may be intermittently turned on during a period in which the fourth transistor is off.

A latch circuit that holds the differential output signal pair may be included.

A waveform shaping circuit that performs waveform shaping of the differential output signal pair output from both the drains of the first transistor and the second transistor may be included, and a signal after waveform shaping is performed by the waveform shaping circuit may be input to the latch circuit.

The waveform shaping circuit may include two inverters that invert logic of the differential output signal pair.

A fifth transistor that switches whether or not to perform a holding operation by the latch circuit in accordance with the logic of the first signal may be included, and the fifth transistor may be intermittently turned on during a period in which the fourth transistor is off.

The fourth transistor may have a conductivity type different from a conductivity type of the third transistor.

The first transistor, the second transistor, and the third transistor may include N-type MOS transistors, and the fourth transistor may include a P-type MOS transistor.

The first transistor, the second transistor, and the third transistor may include P-type MOS transistors, and the fourth transistor may include an N-type MOS transistor.

There may be provided the comparator further including:

a first input terminal and a second input terminal to which a first differential input signal pair are input;

a third input terminal and a fourth input terminal to which a second differential input signal pair are input; and a comparison circuit that outputs a signal corresponding to a difference signal of the first differential input signal pair input to the first input terminal and the second input terminal and a difference signal of the second differential input signal pair input to the third input terminal and the fourth input terminal, in which the comparison circuit includes:

a first comparison device that includes sixth to ninth transistors having a same circuit configuration as a circuit configuration of the first to fourth transistors; and a second comparison device that includes tenth to thirteenth transistors having the same circuit configuration as the circuit configuration of the first to fourth transistors.

According to the present disclosure, there is provided an analog to digital converter including: a first sampling switch that switches whether or not to sample one signal of a differential input signal pair;

a first digital to analog converter that converts the one signal sampled into a digital signal including a plurality of bits bit by bit in order, and outputs a signal having a voltage level corresponding to an unconverted bit;

a second sampling switch that switches whether or not to sample another signal of the differential input signal pair;

a second digital to analog converter that converts the another signal sampled into a digital signal including a plurality of bits bit by bit in order, and outputs a signal having a voltage level corresponding to an unconverted bit;

a comparator that outputs a signal corresponding to a difference signal of a first differential input signal pair in which an output signal of the first digital to analog converter and an output signal of the second digital to analog converter form a pair; and a control circuit that controls the first digital to analog converter and the second digital to analog converter on the basis of an output signal of the comparator, in which the comparator includes:

a first transistor and a second transistor that include two sources connected to each other, two gates to which the first differential input signal pair are input, and two drains that output a differential output signal pair corresponding to the difference signal of the first differential input signal pair;

a third transistor that is connected between both the sources of the first transistor and the second transistor and a first reference voltage node, the third transistor being switched on or off in accordance with logic of a first signal; and a fourth transistor that is connected between both the sources of the first transistor and the second transistor and a second reference voltage node, the fourth transistor being switched on or off in accordance with logic of a second signal having logic different from the logic of the first signal.

A filter circuit that samples and outputs the output signal of the first digital to analog converter and the output signal of the second digital to analog converter may be included, and the comparator may output a signal corresponding to the difference signal of the first differential input signal pair in which the output signal of the first digital to analog converter and the output signal of the second digital to analog converter form a pair and a difference signal of a second differential input signal pair output from the filter circuit, the comparator may include:

a first input terminal and a second input terminal to which the first differential input signal pair are input;

a third input terminal and a fourth input terminal to which the second differential input signal pair are input; and a comparison circuit that outputs a signal corresponding to the difference signal of the first differential input signal pair input to the first input terminal and the second input terminal and the difference signal of the second differential input signal pair input to the third input terminal and the fourth input terminal, and the comparison circuit may include the first to fourth transistors.

MODE FOR CARRYING OUT THE INVENTION

Hereinafter, embodiments of a comparator and an analog to digital converter will be described with reference to the drawings. Hereinafter, the description will be focused on the main components of the comparator and the analog to digital converter, but there may exist components and functions that are not illustrated or described in the comparator and the analog to digital converter. The following description does not exclude the components and the functions that are not illustrated or described.

First Embodiment

Figure 1:
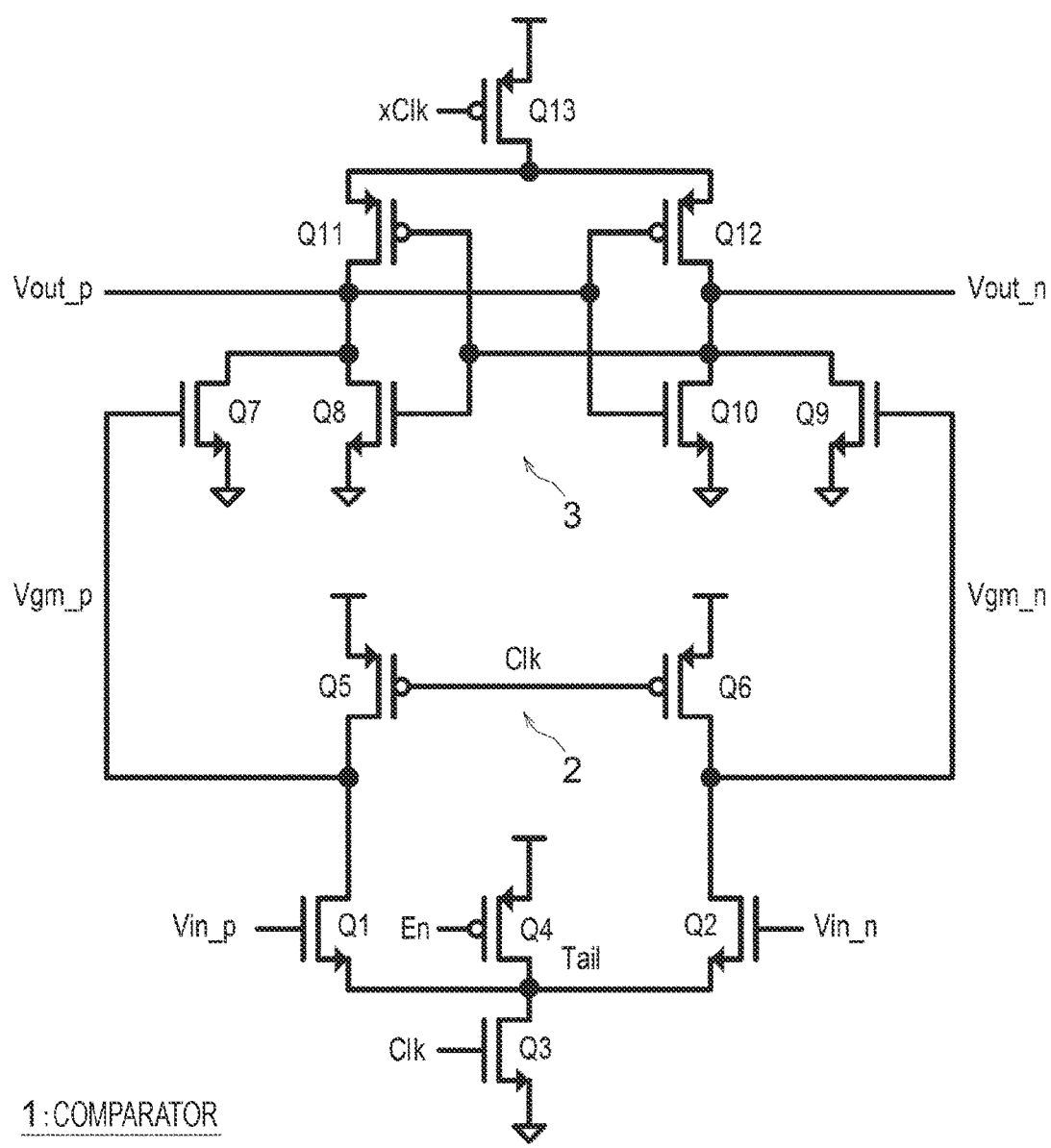
FIG. 1 is a circuit diagram of a comparator according to a first embodiment.

FIG. 1 is a circuit diagram of a comparator 1 according to a first embodiment. The comparator 1 in FIG. 1 is used in, for example, a successive approximation type ADC as described later, but the application of the comparator 1 in FIG. 1 is not necessarily limited to the ADC. A differential input signal pair Vin_p, Vin_n are input to the comparator 1 in FIG. 1. The comparator 1 outputs a differential output signal pair Vout_p, Vout_n corresponding to a difference signal of the differential input signal pair Vin_p, Vin_n. The comparator 1 in FIG. 1 is a kind of double-tail latch-type comparator.

The comparator 1 in FIG. 1 includes transistors (first to fourth transistors) Q1 to Q4. With respect to the transistor Q1 and the transistor Q2, sources thereof are connected to each other, the differential input signal pair Vin_p, Vin_n are input to gates thereof, and a differential output signal pair Vgm_p, Vgm_n are output from drains thereof.

The transistor Q3 is connected between both the sources of the transistor Q1 and the transistor Q2 and a first reference voltage node (for example, a ground node), and is switched on or off in accordance with logic of a first signal. The first signal is, for example, a clock signal Clk having a predetermined frequency. When the clock signal Clk is at a high level, the transistor Q43 is turned on, and the comparator 1 in FIG. 1 performs a comparison operation. The comparator 1 in FIG. 1 is in a stopped state without performing the comparison operation during a period in which the clock signal Clk is at a low level.

The transistor Q4 is connected between both the sources of the transistor Q1 and the transistor Q2 and a second reference voltage node (for example, a power supply voltage node), and is switched on or off in accordance with logic of a second signal having logic different from that of the first signal. The second signal is, for example, an enable signal En. As described later, the enable signal En is turned on in a period in which the comparator 1 in FIG. 1 does not perform the comparison operation. When the transistor Q4 is turned on, a path (hereinafter, it may be referred to as a tail node) connecting both the sources of the transistor Q1 and the transistor Q2 is set to a power supply potential. That is, the tail node connecting both the sources of the transistor Q1 and the transistor Q2 is set to the power supply potential, not to floating during a period in which the comparator 1 in FIG. 1 does not perform the comparison operation. Therefore, the voltage level of the tail node connecting both the sources of the transistor Q1 and the transistor Q2 is fixed to the power supply potential during a period in which the comparator 1 does not perform the comparison operation, and the voltage dependence of input parasitic capacitances Cin_p and Cin_n of a differential input node pair of the comparator 1 can be sufficiently reduced.

In the comparator 1 in FIG. 1, the transistors Q1 to Q3 are N-type MOS transistors, and the transistor Q4 is a P-type MOS transistor. As described later, the conductivity types of the transistors Q1 to Q4 can be reversed from those in FIG. 1.

The comparator 1 in FIG. 1 includes a pull-up circuit 2 and a latch circuit 3 in addition to the transistors Q1 to Q4 described above.

The pull-up circuit 2 includes a transistor (fifth transistor) Q5 and a transistor (sixth transistor) Q6. The transistor Q5 and the transistor Q6 are, for example, P-type MOS transistors. A clock signal Clk is input to both gates of the transistor Q5 and the transistor Q6. Power supply voltage nodes are connected to both sources of the transistor Q5 and the transistor Q6. The differential output signal pair Vout_p, Vout_n are output from respective drains of the transistor Q5 and the transistor Q6.

The latch circuit 3 includes transistors (seventh to thirteenth transistors) Q7 to Q13. The transistors Q7 to Q10 are, for example, N-type MOS transistors, and the transistors Q11 to Q13 are, for example, P-type MOS transistors. The differential output signal pair Vgm_p, Vgm_n are input to respective gates of the transistor Q7 and the transistor Q9. A first output node n1 is connected to each gate of the transistor Q10 and the transistor Q12, and each drain of the transistor Q7, the transistor Q8, and the transistor Q11, and the Vout_p is output. A second output node n2 is connected to each gate of the transistor Q8 and the transistor Q11, and each drain of the transistor Q9, the transistor Q10, and the transistor Q12, and the Vout_n is output. A power supply voltage node is connected to a source of the transistor Q13, and each source of the transistor Q11 and the transistor Q12 is connected to a drain of the transistor Q13. An inversion signal xClk of the clock signal Clk is input to a gate of the transistor Q13.

The comparator 1 in FIG. 1 starts a comparison operation when the clock signal Clk transitions from a ground level (low level) to a power supply voltage level (high level). Before the comparator 1 in FIG. 1 starts the comparison operation, the clock signal Clk is at a low level, and the differential output signal pair Vgm_p, Vgm_n are pulled up to the power supply level.

When the clock signal Clk transitions to the power supply level, potentials of the differential output signal pair Vgm_p and Vgm_n decrease due to discharging by the transistors Q1, Q2. When "Vin_p>Vin_n", "discharge rate of Vgm_p>discharge rate of Vgm_n" is obtained. On the other hand, when "Vin_p<Vin_n", "discharge rate of Vgm_p<discharge rate of Vgm_n" is obtained. In this manner, the difference signal (Vin_p−Vin_n) of the differential input signal pair Vin_p, Vin_n of the comparator 1 causes a difference in discharge rate between Vgm_p and Vgm_n.

Furthermore, logic of the latch circuit 3 is determined according to the difference in discharge rate. If "discharge rate of Vgm_p>discharge rate of Vgm_n", Vout_p=high/Vout_n=low is obtained, and if "discharge rate of Vgm_p<discharge rate of Vgm_n", Vout_p=low/Vout_n=high is obtained.

Figure 2:
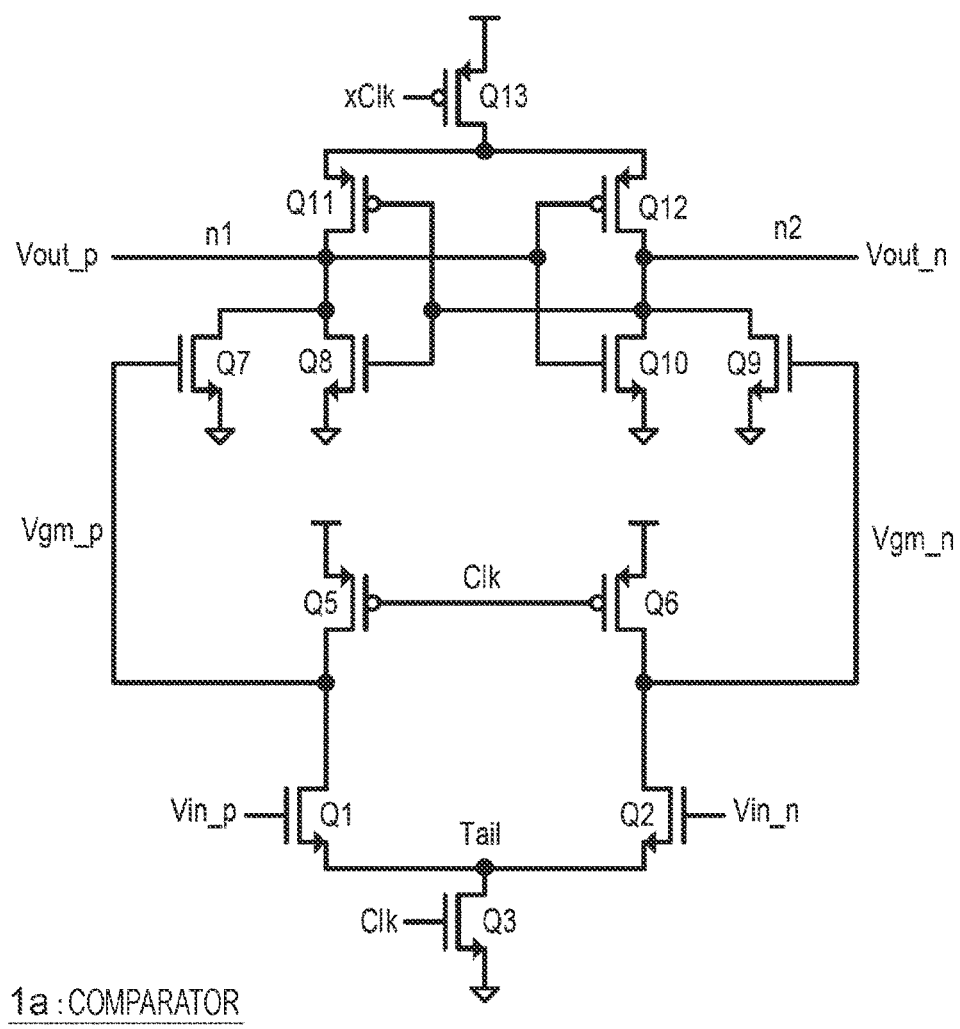
FIG. 2 is a circuit diagram of a comparator according to a comparative example.

FIG. 2 is a circuit diagram of a comparator 1a according to a comparative example. In FIG. 2, components common to those in FIG. 1 are denoted by the same reference numerals, and the description will be focused on differences hereinafter.

In the comparator 1a in FIG. 2, the transistor Q4 in FIG. 1 is omitted. Other circuit configurations are similar to those in FIG. 1. In the comparator 1a in FIG. 2, source potentials of the transistors Q1, Q2 are in a floating state during a period in which a comparison operation is not performed. Therefore, an input voltage dependent error occurs in the voltage level of the differential input node pair due to input parasitic capacitances of input nodes of the differential input signal pair Vin_p, Vin_n of the comparator 1a.

Figure 3:
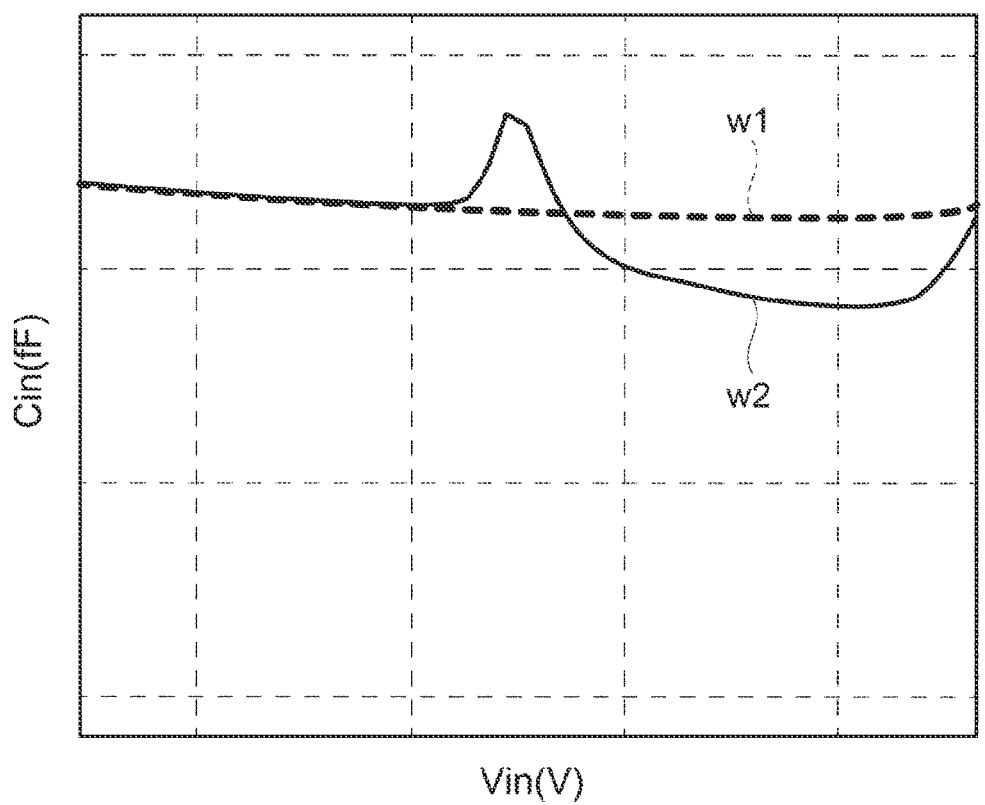
FIG. 3 is a graph illustrating input voltage dependence of input parasitic capacitances of the comparators in FIGS. 1 and 2.

FIG. 3 is a graph illustrating the input voltage dependence of input parasitic capacitances of the comparators 1, 1a in FIGS. 1 and 2. FIG. 3 illustrates simulation results. In FIG. 3, the horizontal axis represents the input voltage [V], and the vertical axis represents the input parasitic capacitance [fF]. In FIG. 3, a broken line waveform w1 indicates the input voltage dependence of the comparator 1 in FIG. 1, and a solid line waveform w2 indicates the input voltage dependence of the comparator 1a in FIG. 2. The broken line waveform w1 in FIG. 3 is a result of simulation performed in a state in which the enable signal En is set to a low level, and the tail node connecting the sources of the transistors Q1, Q2 to each other is pulled up to the power supply voltage in the comparator 1 in FIG. 1. In the comparator 1a in FIG. 2, the input parasitic capacitance greatly fluctuates according to the input voltage, but in the comparator 1 in FIG. 1, a fluctuation amount of the input parasitic capacitance is greatly suppressed even if the input voltage changes.

Figure 4:
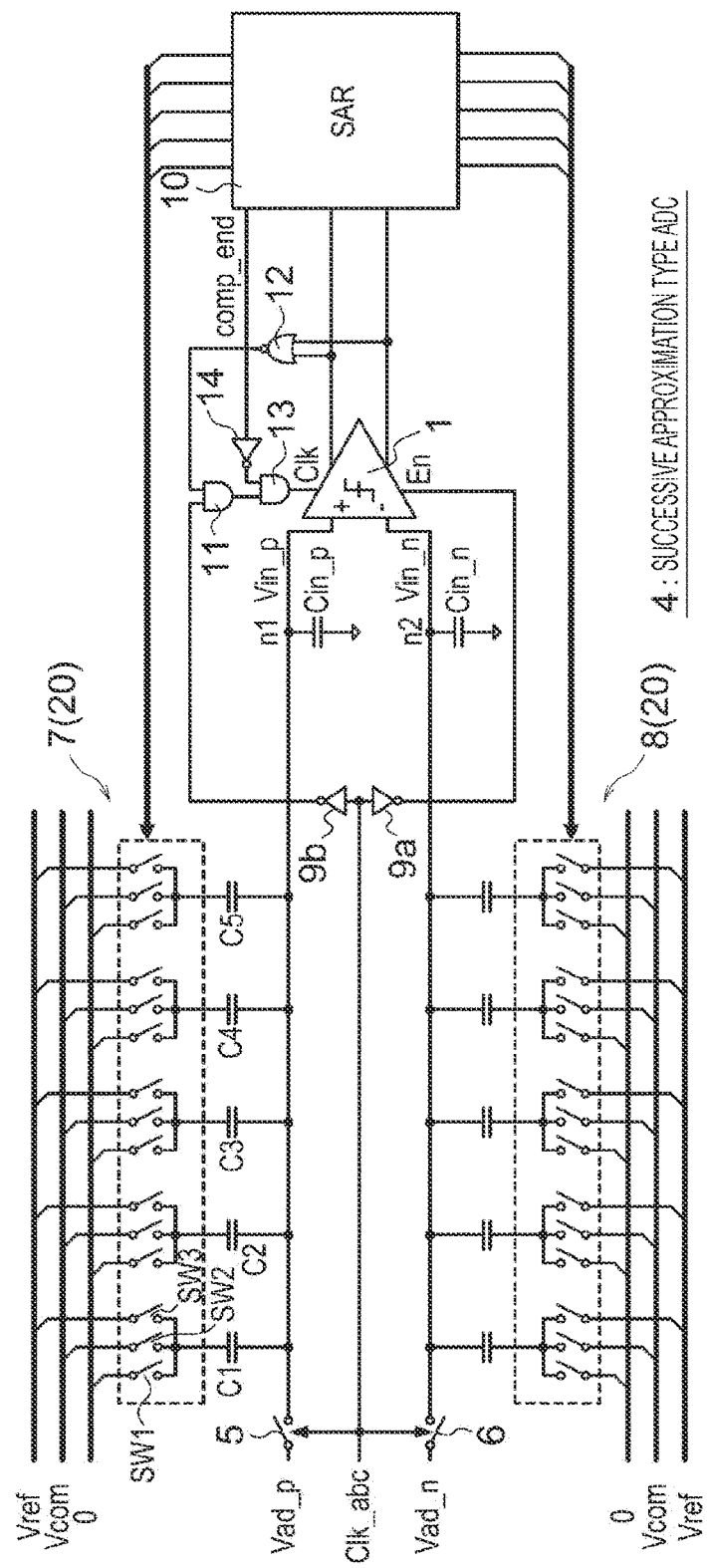
FIG. 4 is a circuit diagram of a successive approximation type ADC 4 including the comparator in FIG. 1.

FIG. 4 is a circuit diagram of a successive approximation type ADC 4 including the comparator 1 in FIG. 1. The successive approximation type ADC 4 in FIG. 4 illustrates an example in which the differential input signal pair Vin_p, Vin_n are converted into a 5-bit digital signal. Note that the bit depth of the successive approximation type ADC 4 is arbitrary. Furthermore, the circuit configuration of the successive approximation type ADC 4 is not limited to that in FIG. 4.

The successive approximation type ADC 4 in FIG. 4 includes a first sampling switch 5, a second sampling switch 6, a first digital to analog converter (hereinafter, first DAC)

7, a second digital to analog converter (second DAC) 8, the comparator 1, and a control circuit (SAR logic) 10. In the present specification, the first DAC 7 and the second DAC 8 are collectively referred to as a capacitive DAC 20.

The first sampling switch 5 switches whether or not to sample one signal Vin_p of the differential input signal pair Vin_p, Vin_n. The second sampling switch 6 switches whether or not to sample the other signal Vin_n of the differential input signal pair Vin_p, Vin_n.

The first DAC 7 converts the one sampled signal Vin_p into a digital signal including a plurality of bits bit by bit in order, and outputs a signal having a voltage level corresponding to unconverted bits.

The first DAC 7 includes five capacitors C1 to C5 having different capacitances by powers of two, and three switches (first to third switches) SW1 to SW3 connected to each of the capacitors C1 to C5. The first switches SW1 switch whether or not to set one ends of the corresponding capacitors C1 to C5 to 0 V. The second switches SW2 switch whether or not to set one ends of the corresponding capacitors C1 to C5 to a common voltage Vcom. The third switches SW3 switch whether or not to set one ends of the corresponding capacitors C1 to C5 to a reference voltage Vref. The common voltage Vcom is, for example, a voltage level of ½ of the reference voltage Vref.

The first to third switches SW1 to SW3 are switched on or off on the basis of a control signal from the control circuit 10. The control circuit 10 turns on the second switch SW2 at the start of a comparison operation. Thereafter, the control circuit 10 turns on the first switch SW1 in a case where it is desired to lower the output node voltage Vin_p of the first DAC 7, and turns on the third switch SW3 in a case where it is desired to increase the output node voltage Vin_p of the first DAC 7.

The second DAC 8 converts the other sampled signal into a digital signal including a plurality of bits bit by bit in order, and outputs a signal having a voltage level corresponding to unconverted bits. The second DAC 8 is configured similarly to the first DAC 7, and switches the first to third switches SW1 to SW3 on the basis of the control signal from the control circuit 10 similarly to the first DAC 7.

The comparator 1 has the configuration illustrated in FIG. 1. The differential input signal pair Vin_p, Vin_n in which an output signal of the first DAC 7 and an output signal of the second DAC 8 form a pair are input to the comparator 1. The comparator 1 outputs signals corresponding to the difference signal of the differential input signal pair Vin_p, Vin_n.

The control circuit 10 performs switching control of the first to third switches SW1 to SW3 in the first DAC 7 and the second DAC 8 on the basis of the output signals of the comparator 1.

A control signal Clk_adc is input to the ADC 4. The control signal Clk_adc is inverted by an inverter 9a to generate an enable signal En. The enable signal En is input to the gate of the transistor Q4 in the comparator 1 in FIG. 1. When the control signal Clk_adc is at a high level, the enable signal En becomes a low level, and the transistor Q4 pulls up the tail node connecting the sources of the transistors Q1, Q2 to each other.

Furthermore, an inversion signal of the control signal Clk_adc by an inverter 9b is input to an AND gate 11. When the control signal Clk_adc becomes a low level from a high level, the clock signal Clk becomes a high level. Accordingly, the comparator 1 performs a comparison operation. The differential output signal pair Vout_p, Vout_n output from the comparator 1 are input to the control circuit 10 and input to a NOR gate 12. When one signal of the differential output signal pair Vout_p, Vout_n becomes a high level, the output of the NOR gate 12 becomes a low level. In this case, the output of an AND gate 13 becomes a low level, and the clock signal Clk is fixed at a low level. Accordingly, the comparator 1 is reset.

The AND gate 11 calculates a logical product of the signal obtained by inverting the control signal Clk_adc by the inverter 9b and the output signal of the NOR gate 12. The output of the AND gate 11 becomes a high level in a case where the control signal Clk_adc is at a low level and both the differential output signal pair Vout_p, Vout_n of the comparator 1 are at a low level.

The AND gate 13 calculates a logical product of the output signal of the AND gate 11 and the signal obtained by inverting a flag signal comp_end of the control circuit 10 by the inverter 14. The output of the AND gate 13 becomes a high level in a case where the flag signal comp_end of the control circuit 10 is at a low level, and in a case where the output of the AND gate 11 is at a high level. When all control in the capacitive DAC 20 is completed, the control circuit 10 sets the flag signal comp_end to a high level.

In the ADC 4 in FIG. 4, first, the first sampling switch 5 and the second sampling switch 6 are turned on, and the differential input signal pair Vin_p, Vin_n are sampled to the capacitive DAC 20. At this time, logic of the control signal Clk_adc is at a high level, and the clock signal Clk input to the comparator 1 is at a low level.

Thereafter, when the control signal Clk_adc transitions from the high level to the low level, sampling is completed, and the clock signal Clk transitions from the low level to the high level, and the comparator 1 starts a comparison operation. The control circuit 10 turns on any of the first to third switches SW1 to SW3 connected to the capacitor of the most significant bit in the capacitive DAC 20 on the basis of the comparison result by the comparator 1, and controls the output voltage (Vin_p−Vin_n) of the capacitive DAC 20. The control circuit 10 controls switching on or off of the first to third switches SW1 to SW3 connected to the capacitors C1 to C5 bit by bit in order from the high-order side bit in the capacitive DAC 20. Therefore, the output voltage (Vin_p−Vin_n) of the capacitive DA is gradually approaches zero.

In the control circuit 10, the output of the NOR gate 12 transitions to a low level each time each comparison operation ends. Therefore, the clock signal Clk, which is the output of the AND gate 13, becomes a low level, and the transistor Q3 in the comparator 1 is turned off. Therefore, the comparator 1 is reset each time each comparison operation ends. Thereafter, when the output of the AND gate 13 transitions to a high level, and the clock signal Clk becomes a high level, switching on or off of the first to third switches SW1 to SW3 connected to the capacitor C2, which is a second bit from the most significant bit in the capacitive DAC 20, is performed.

By repeating the above control, the output voltage of the capacitive DAC 20 gradually approaches zero. The capacitive DAC 20 in FIG. 4 has 5 bits, so that charging and discharging control of the capacitors C1 to c5 in the capacitive DAC 20 is performed five times. When the charging and discharging control is completed, the control circuit 10 outputs the flag signal comp_end, the Clk becomes low, and the comparator 1 becomes a reset state. Thereafter, when the control signal Clk_adc transitions from low to high, the differential input signal pair Vin_p, Vin_n are sampled again.

Input parasitic capacitances Cin_p, Cin_n exist in a differential input node pair n1, n2 of the comparator 1 in FIG.

4. In the embodiment, the tail node connecting the sources of the transistors Q1, Q2 to each other is pulled up to the power supply voltage by the transistor Q4 during a period in which the comparator 1 does not perform a comparison operation. Therefore, even if there are input parasitic capacitances in the differential input node pair n1, n2, the input voltage dependence of the parasitic capacitances can be suppressed.

Accordingly, the control amount when controlling the capacitive DAC 20 is not affected by an input voltage dependent error of the differential input node pair n1, n2, so that deterioration of various characteristics such as distortion of the ADC 4 can be suppressed.

Figure 5:
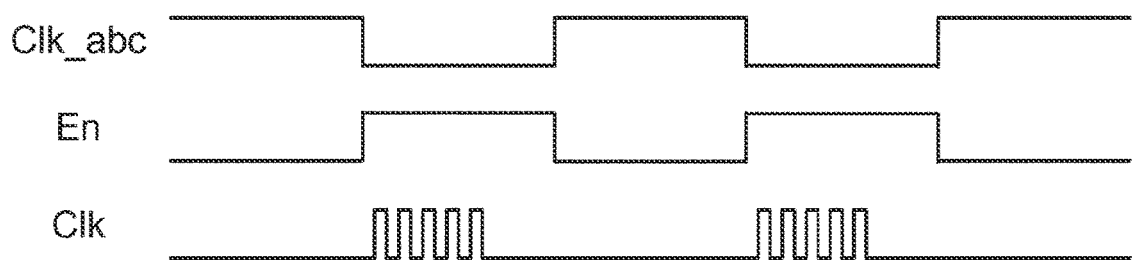
FIG. 5 is a waveform diagram of a control signal, an enable signal, and a clock signal of the comparator in FIG. 4.

FIG. 5 is a waveform diagram of the control signal Clk_adc, the enable signal En, and the clock signal Clk in the comparator 1 in FIG. 4. As illustrated, the logic of the control signal Clk_adc is opposite to that of the enable signal En. The clock signal Clk intermittently becomes a high level a plurality of times during a period in which the enable signal En is at a high level. The comparator 1 performs a comparison operation during a period in which the clock signal Clk is at a high level. In a case where the capacitive DAC 20 includes five capacitors C1 to C5, the comparator 1 performs the comparison operation five times, and turns on to any of the first to third switches SW1 to SW3 connected to one ends of the capacitors in order from the capacitor on the high-order side to control charging and discharging of the capacitor.

Figure 6:
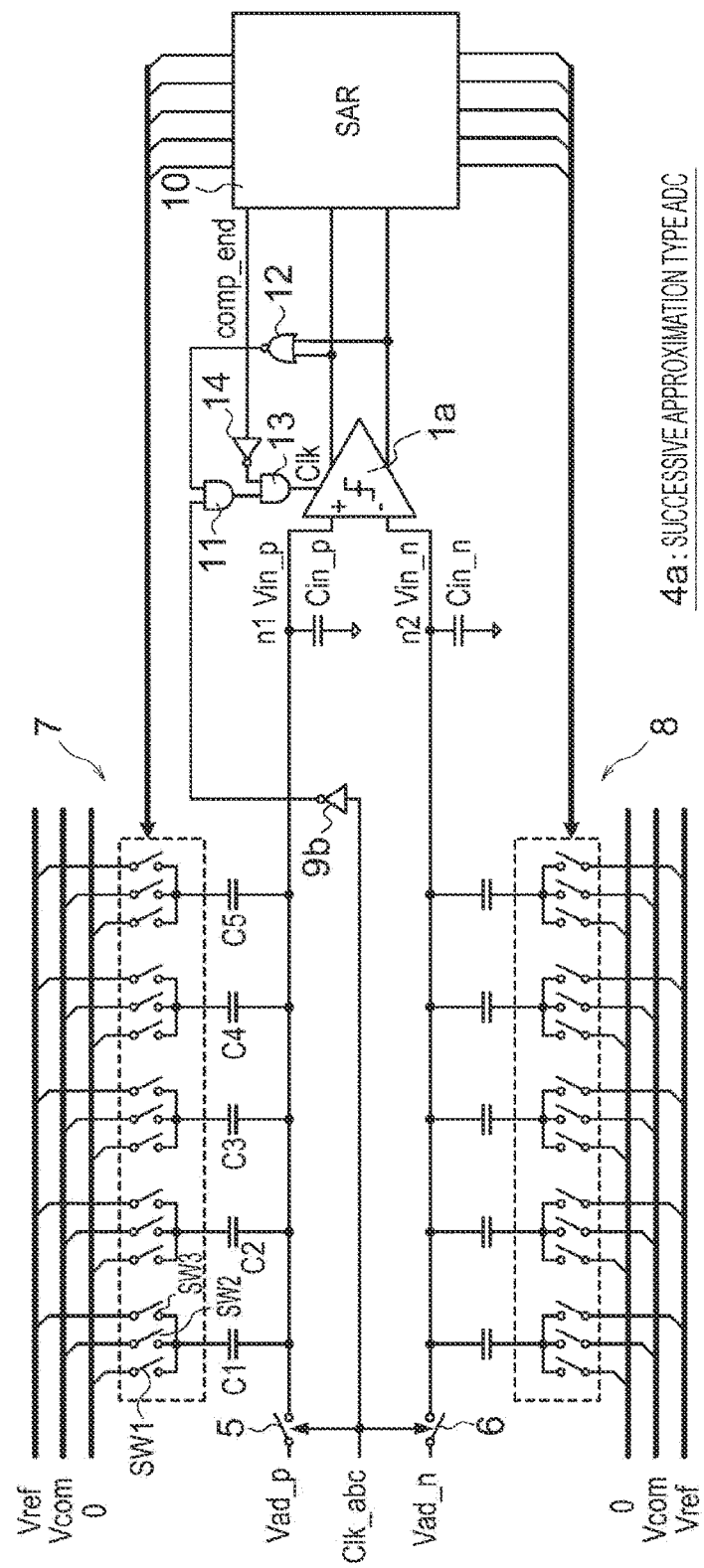
FIG. 6 is a circuit diagram of a successive approximation type ADC, according to a comparative example, including the comparator in FIG. 2.

FIG. 6 is a circuit diagram of a successive approximation type ADC 4a, according to a comparative example, including the comparator 1a in FIG. 2. The ADC 4a in FIG. 6 has a configuration in which the inverter 9b is omitted from the ADC 4 in FIG. 4. The enable signal En is not input to the comparator 1a in the ADC 4a in FIG. 6.

In the ADC 4a in FIG. 6, during a sampling period of the differential input signal pair Vin_p, Vin_n, the logic of the control signal Clk_adc is at a high level, and the clock signal Clk input to the comparator 1a is at a low level. That is, during the sampling period, the tail node connecting the sources of the transistors Q1, Q2 in the comparator 1 in FIG. 2 to each other is floating, and the potential is undefined.

The input parasitic capacitances Cin_p, Cin_n of the comparator 1 exist in the output signal paths n1, n2 of the capacitive DAC 20 in the ADC 4a in FIG. 6. In the state where the tail node connecting the sources of the transistors Q1, Q2 in the comparator 1 to each other is in a floating state, the input parasitic capacitances Cin_p, Cin_n have input voltage dependence. More specifically, when the first sampling switch 5 and the second sampling switch 6 are turned on to sample the differential input signal pair Vin_p, Vin_n, the differential input signal pair Vin_p, Vin_n are sampled also in the input parasitic capacitances Cin_p, Cin_n. Charges sampled in the input parasitic capacitances Cin_p, Cin_n are determined according to capacitance values of the input parasitic capacitances Cin_p and Cin_n. However, when the input parasitic capacitances Cin_p and Cin_n have input voltage dependence, charges stored in the input parasitic capacitances Cin_p and Cin_n also have input voltage dependence. This dependence of the charges gives an input voltage dependent error to the control amount when controlling the capacitive DAC 20, and also gives an input voltage dependent error to the conversion result of the ADC 4a. As a result, there is a possibility that deterioration of various characteristics such as distortion of the ADC 4a is caused.

On the other hand, in the comparator 1 in FIG. 1, the tail node connecting the sources of the transistors Q1, Q2 in the comparator 1 to each other is pulled up to the power supply voltage by the transistor Q4 at the time of sampling the differential input signal pair Vin_p, Vin_n. Accordingly, there is no possibility that the input parasitic capacitances Cin_p and Cin_n have input voltage dependence, so that the capacitive DAC 20 can be controlled with high accuracy.

In this manner, in the comparator 1 according to the first embodiment, the tail node connecting the sources of the transistors Q1, Q2, which generate signals corresponding to the difference signal of the differential input signal pair Vin_p, Vin_n, to each other is pulled up to the power supply voltage level before the comparator 1 starts the comparison operation. Therefore, the input parasitic capacitances Cin_p, Cin_n of the comparator 1 do not have input voltage dependence, so that the comparison operation by the comparator 1 can be performed with high accuracy. Accordingly, AD conversion accuracy of the ADC 4 incorporating the comparator 1 can also be improved.

Second Embodiment

A comparator 1b according to a second embodiment is obtained by reversing the conductivity type of each transistor in the comparator 1b from that in the comparator 1 in FIG. 1.

Figure 7:
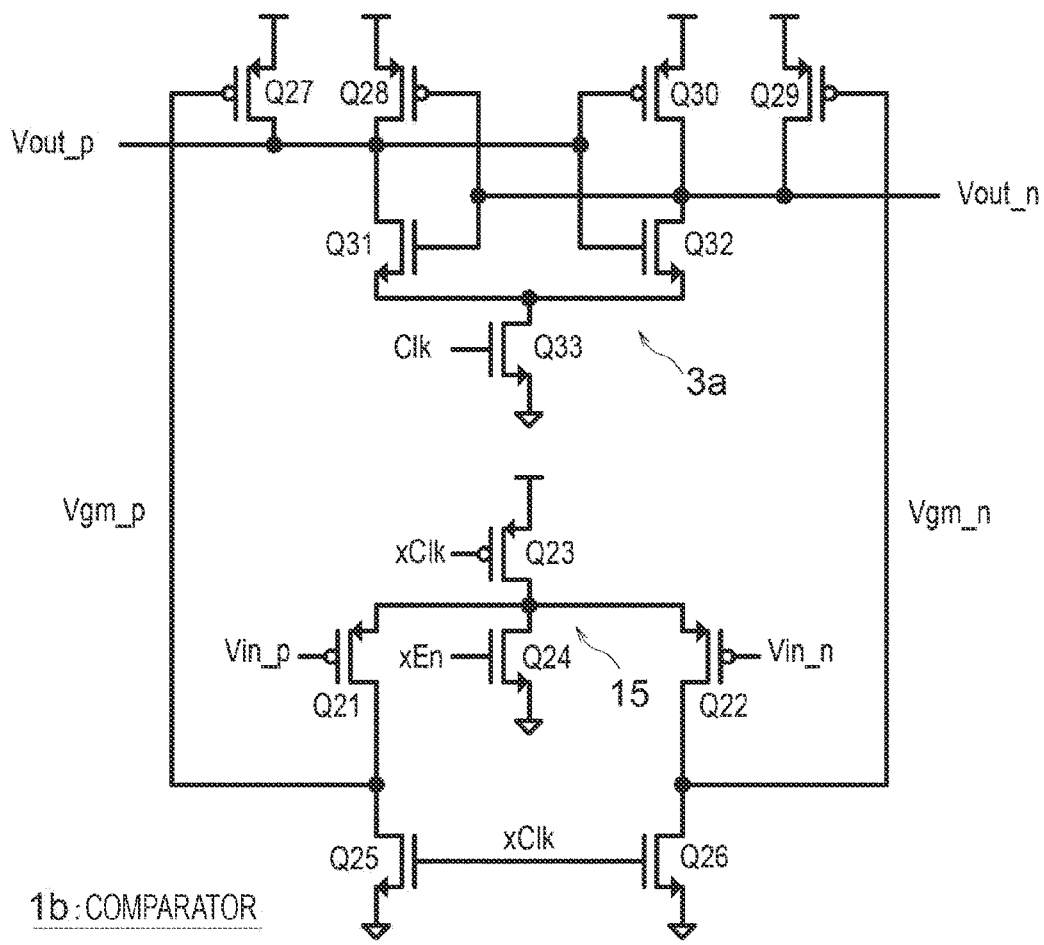
FIG. 7 is a circuit diagram of a comparator according to a second embodiment.

FIG. 7 is a circuit diagram of the comparator 1b according to the second embodiment. The comparator 1b in FIG. 7 includes transistors Q21 to Q24. The transistors Q21 to Q23 are P-type MOS transistors, and the transistor Q24 is an N-type MOS transistor. An inversion signal xEn of the enable signal En in FIG. 1 is input to a gate of the transistor Q24. An inversion signal of the clock signal Clk in FIG. 1 is input to a gate of the transistor Q23.

In addition, the comparator 1b in FIG. 7 includes a pull-down circuit 15 and a latch circuit 3a. The pull-down circuit 15 includes a transistor Q45 and a transistor Q46 connected between respective drains of the first and the transistor Q2 and the ground terminals. The inversion signal xClk of the clock signal Clk is input to each gate of the transistor Q45 and the transistor Q46. The transistor Q45 and the transistor Q46 are N-type MOS transistors.

The latch circuit 3a includes transistors Q27 to Q33. Among them, the transistors Q27 to Q30 are P-type MOS transistors, and the transistors Q31 to Q33 are N-type MOS transistors.

In the comparator 1b in FIG. 7, the conductivity type of each transistor is opposite to that in the comparator 1 in FIG. 1, and connection order of the transistors connected between the power supply voltage node and the ground node is opposite to that in the comparator 1 in FIG. 1, but the comparison operation itself is the same.

When the xClk transitions to a low level, potentials of the differential output voltage pair Vgm_p, Vgm_n increase due to charging by the transistors Q1, Q2. When "Vin_p>Vin_n", "charge speed of Vgm_p<charge speed of Vgm_n" is obtained. On the other hand, when "Vin_p<Vin_n", "charge speed of Vgm_p>charge speed of Vgm_n" is obtained. In this manner, the difference signal (Vin_p−Vin_n) of the differential input voltage pair of the comparator 1b causes a difference in charge speed between Vgm_p and Vgm_n.

Moreover, logic of the latch circuit 3a in the subsequent stage is determined according to the difference in charge speed. If "charge speed of Vgm_p<charge speed of Vgm_n", Vout_p=High/Vout_n=Low is obtained, and if "charge speed of Vgm_p>charge speed of Vgm_n", Vout_p=Low/Vout_n=High is obtained.

The transistor Q24 is provided at the tail node connecting sources of the transistors Q1, Q2 in the comparator 1b in FIG. 7 to each other. The transistor Q24 is controlled by the inversion signal xEn of the enable signal En. The transistor Q24 is turned on to be pulled down to the ground level while the ADC 4 performs sampling. In this state, the voltage dependence of the input parasitic capacitances Cin_p and Cin_n of the comparator 1b can be sufficiently reduced. Therefore, deterioration of various characteristics such as distortion of the ADC 4 can be prevented.

Third Embodiment

In a third embodiment, configurations of a pull-up circuit 2 and a latch circuit 3 are different from those in FIG. 1.

Figure 8:
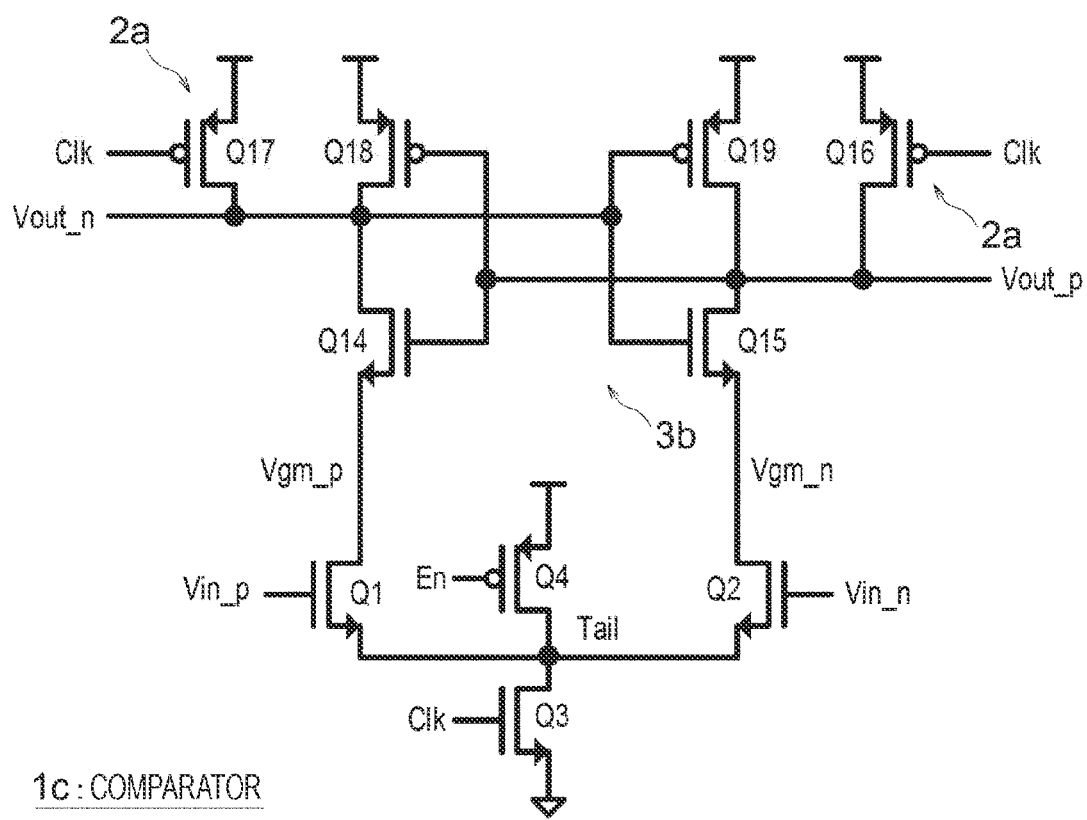
FIG. 8 is a circuit diagram of a comparator according to a third embodiment.

FIG. 8 is a circuit diagram of a comparator 1c according to the third embodiment. The comparator 1c in FIG. 8 includes N-type MOS transistors Q1 to Q4, Q14 to Q15, and P-type MOS transistors Q16 to Q19.

The transistors Q16, Q17 constitute a pull-up circuit 2a. In FIG. 1, the pull-up circuit 2 is connected to the drains of the transistors Q1, Q2, but in FIG. 8, the pull-up circuit 2a is connected to a first output node and a second output node Vout_p, Vout_n.

A latch circuit 3b in FIG. 8 includes the transistors Q14, Q15, Q18, and Q19. Each gate of the transistors Q14, Q18 and each drain of the transistors Q15, Q19 are connected to the first output node Vout_p. Each gate of the transistors Q15, Q19 and each drain of the transistors Q14, Q18 are connected to the second output node Vout_n.

Also in the comparator 1c in FIG. 8, each drain of the transistors Q3, Q4 is connected to the tail node connecting the respective sources of the transistors Q1, Q2, and when the enable signal En is at a low level, the transistor Q4 is turned on to pull up the tail node to the power supply voltage level. Therefore, the voltage dependence of the input parasitic capacitances Cin_p and Cin_n of the comparator 1c can be sufficiently reduced, so that deterioration of various characteristics such as distortion of the ADC 4 can be prevented.

Fourth Embodiment

In a fourth embodiment, a differential signal output pair output from the respective drains of the transistors Q1, Q2 are waveform-shaped and then input to a latch circuit 3.

Figure 9:
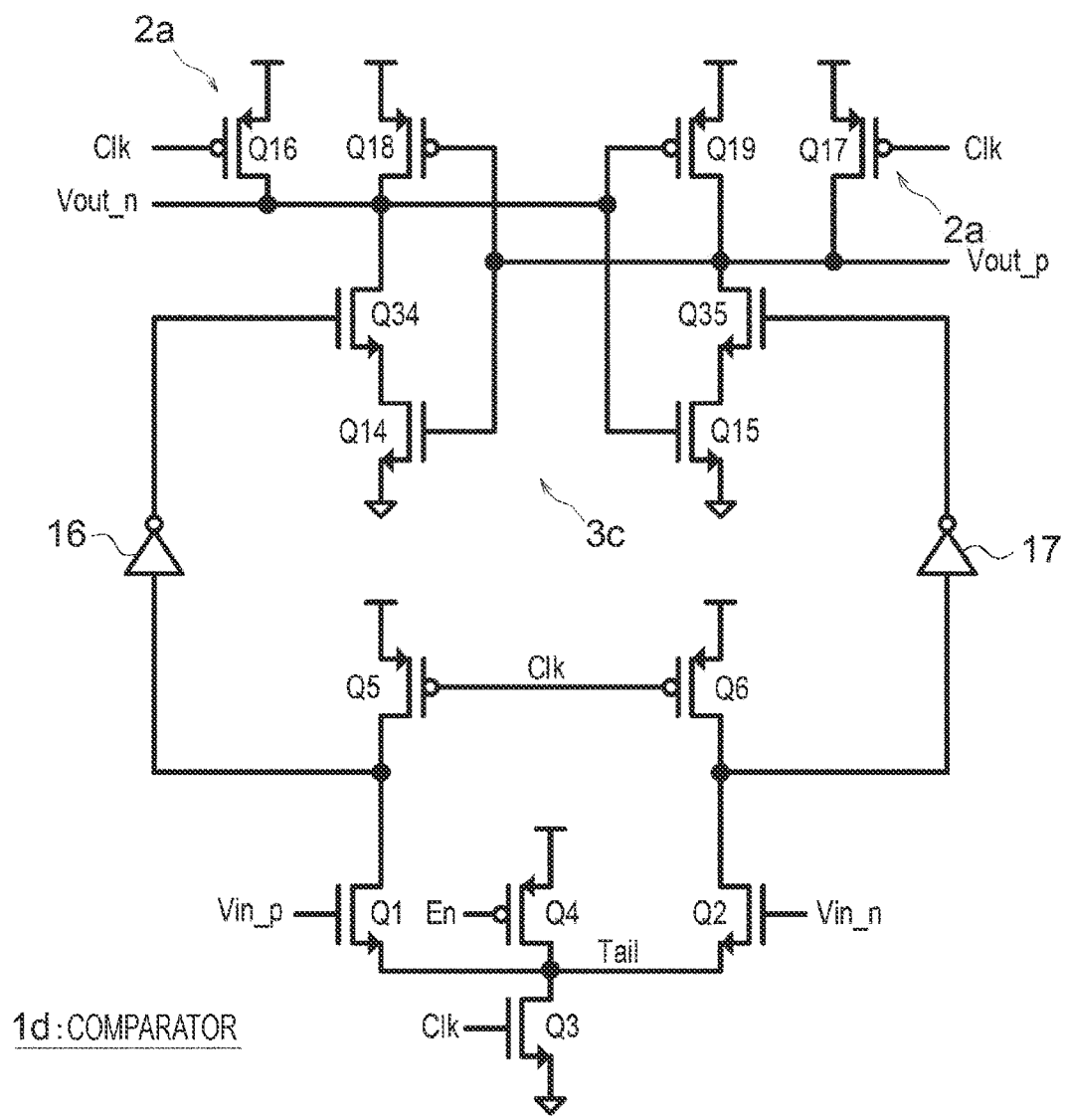
FIG. 9 is a circuit diagram of a comparator according to a fourth embodiment.

FIG. 9 is a circuit diagram of a comparator 1d according to the fourth embodiment. The comparator 1d in FIG. 9 includes inverters 16, 17 connected to the drains of the transistors Q1, Q2. Output signals of the inverters 16, 17 are input to a latch circuit 3c. The latch circuit 3c includes N-type MOS transistors Q14 to Q17, Q34, and Q35, and P-type MOS transistors Q18, Q19.

The latch circuit 3c in FIG. 9 has a configuration in which the transistors Q34, Q35 are added to the latch circuit 3b in FIG. 8. The transistor Q34 is connected between the respective drains of the transistors Q14, Q18. The transistor Q35 is connected between the respective drains of the transistors Q15, Q19.

Output signals of the inverters 16, 17 are input to the respective gates of the transistors Q34, Q35.

The inverters 16, 17 perform waveform shaping to steepen waveforms of the differential output signal pair Vout_p, Vout_n output from the respective drains of the transistors Q1, Q2. By inputting the differential output signal pair Vout_p, Vout_n to the latch circuit 3c via the inverters 16, 17, a latch operation of the latch circuit 3c can be speeded up.

Also in the comparator 1d in FIG. 9, each drain of the transistors Q3, Q4 is connected to the tail node connecting the respective sources of the transistors Q1, Q2, and when the enable signal En is at a low level, the transistor Q4 is turned on to pull up the tail node to the power supply voltage level. Therefore, the voltage dependence of the input parasitic capacitances Cin_p and Cin_n of the comparator 1 can be sufficiently reduced, so that deterioration of various characteristics such as distortion of the ADC 4 can be prevented.

Fifth Embodiment

The comparators 1 to 1d in FIGS. 1 and 7 to 9 described above can be used in the ADC 4 in FIG. 4, but can also be applied to other types of ADCs, and there may be a case where internal configurations of the comparators 1 to 1d need to be partially changed in accordance with the configuration of the ADC.

Figure 10:
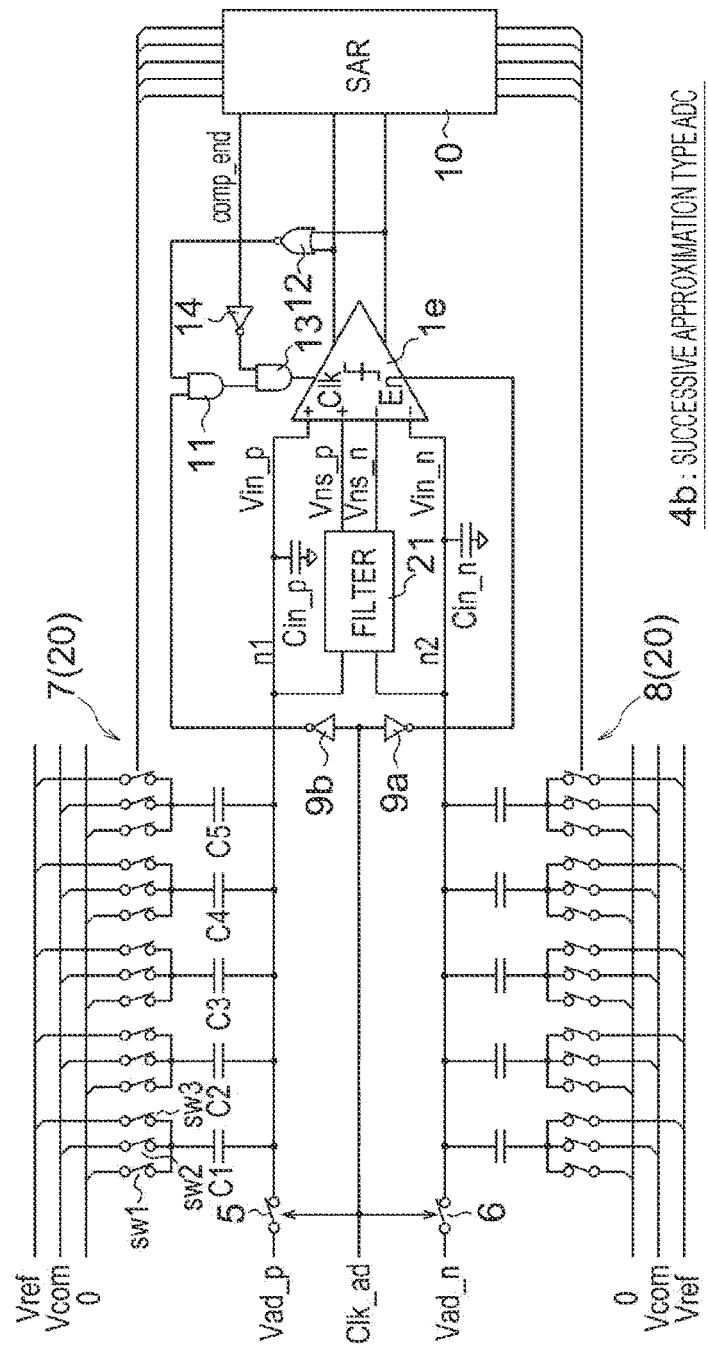
FIG. 10 is a circuit diagram of an ADC including a filter circuit in addition to a capacitive DAC.

FIG. 10 is a circuit diagram of an ADC 4b including a filter circuit 21 in addition to the capacitive DAC 20. The filter circuit 21 in FIG. 10 samples a differential output signal pair Vin_p, Vin_n output from the capacitive DAC 20. The first differential output signal pair Vin_p, Vin_n output from the capacitive DAC 20 and a second differential output signal pair Vns_p, Vns_n output from the filter circuit 21 are input to a comparator 1e in the ADC 4b in FIG. 10. In this manner, the comparator 1e in FIG. 10 includes terminals to which two differential input signal pairs (Vin_p, Vin_n), (Vns_p, Vns_n) are input, and outputs signals corresponding to the difference signals of the respective differential input signal pairs (Vin_p, Vin_n), (Vns_p, Vns_n).

The ADC 4b in FIG. 10 includes the filter circuit 21. Accordingly, the differential output signals, of the capacitive DAC 20, that have not become zero are sampled by the filter circuit 21, and are input to the comparator 1e. Therefore, accuracy of analog to digital conversion can be further improved.

Figure 11:
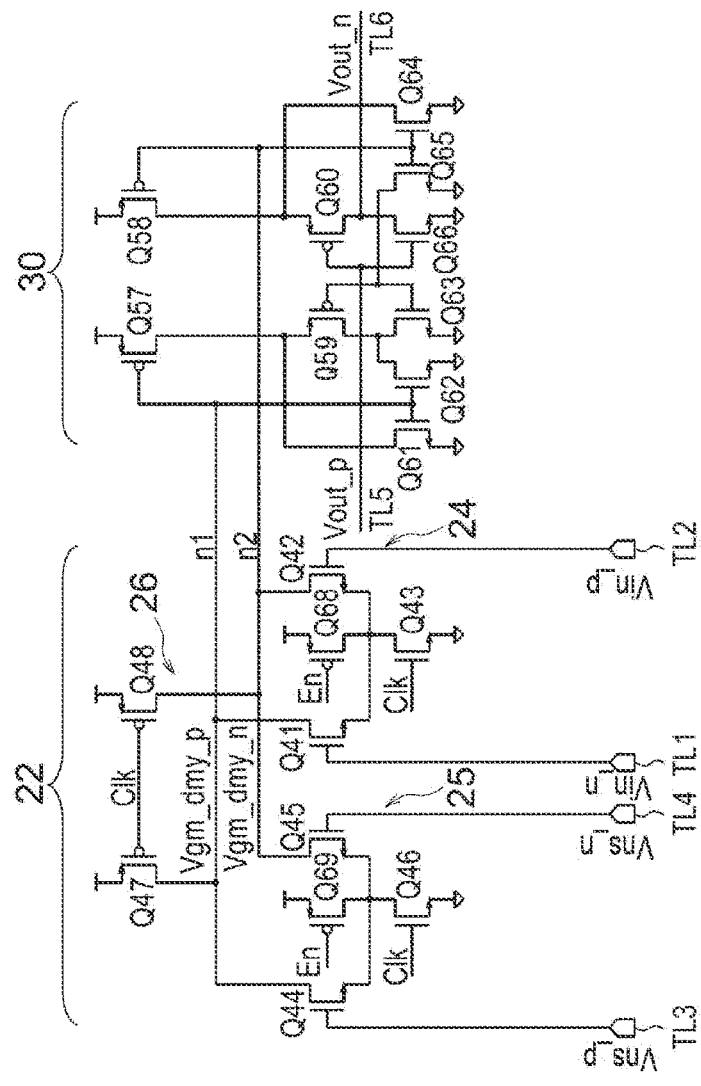
FIG. 11 is a circuit diagram illustrating an example of an internal configuration of a comparator used in the ADC in FIG. 10.

FIG. 11 is a circuit diagram illustrating an example of an internal configuration of the comparator 1e used in the ADC 4b in FIG. 10. The comparator 1e in FIG. 11 includes a first input terminal TL1 and a second input terminal TL2 to which the first differential input signal pair Vin_p, Vin_n are input, a third input terminal TL3 and a fourth input terminal TL4 to which the second differential input signal pair Vns_p, Vns_n are input, and a comparison circuit 22.

The comparison circuit 22 outputs signals corresponding to a difference signal of the first differential input signal pair Vin_p, Vin_n input to the first input terminal TL1 and the second input terminal TL2 and a difference signal of the second differential input signal pair Vns_p, Vns_n input to the third input terminal TL3 and the fourth input terminal TL4.

The comparison circuit 22 outputs, to the first output node n1 and the second output node n2, a first differential output signal pair, corresponding to the difference signal of the first differential input signal pair Vin_p, Vin_n, generated by connecting the first input terminal TL1 to a positive side and connecting the second input terminal TL2 to a negative side. The voltage fluctuation amount of the third input terminal TL3 generated according to the voltage fluctuation of the first output node n1 is equal to the voltage fluctuation amount of the fourth input terminal TL4 generated according to the voltage fluctuation of the second output node n2.

The comparison circuit 22 includes a first comparison device 24 and a second comparison device 25.

The first comparison device 24 outputs, to the first output node n1 and the second output node n2, the first differential output signal pair, corresponding to the difference signal of the first differential input signal pair Vin_p, Vin_n, generated by connecting the first input terminal TL1 to the positive side and connecting the second input terminal TL2 to the negative side.

The second comparison device 25 outputs, from the first output node n1 and the first output node n2, the second differential output signal pair, corresponding to the difference signal of the second differential input signal pair, generated by connecting the third input terminal TL3 to the positive side and connecting the fourth input terminal TL4 to the negative side.

The first comparison device 24 includes N-type MOS transistors Q41, Q42. The first differential input signal Vin_p is input to a gate of the transistor Q41. The gate of the transistor Q41 is the positive side. The first differential input signal Vin_n is input to a gate of the transistor Q42. The gate of the transistor Q42 is the negative side.

An N-type MOS transistor Q43 is connected between respective sources of the transistors Q41, Q42 and a ground node. A clock signal Clk is input to a gate of the transistor Q43. The transistors Q41, Q42 perform a comparison operation of the first differential input signal pair Vin_p, Vin_n when the clock signal Clk is at a high level, and stop the comparison operation when the clock signal Clk is at a low level. A drain of the transistor Q41 is connected to the first output node n1, and a drain of the transistor Q42 is connected to the second output node n2.

Furthermore, a P-type MOS transistor Q68 is connected between the sources of the transistors Q41, Q42 and a power supply voltage node (second reference voltage node). An enable signal En is input to a gate of the transistor Q68. The transistor Q68 performs the same operation as the transistor Q4 in FIG. 1.

The second comparison device 25 includes N-type MOS transistors Q44, Q45. The first differential input signal Vns_p is input to a gate of the transistor Q44. The gate of the transistor Q44 is the positive side. The second differential input signal Vns_n is input to a gate of the transistor Q45. The gate of the transistor Q45 is the negative side.

An N-type MOS transistor Q46 is connected between sources of the transistors Q44, Q45 and a ground node. A clock signal Clk is input to a gate of the transistor Q46. The transistors Q41, Q42 perform a comparison operation of the first differential input signal pair Vin_p, Vin_n when the clock signal Clk is at a high level, and stop the comparison operation when the clock signal Clk is at a low level. Respective drains of the transistors Q44, Q45 are connected to the first output node n1 and the second output node n2.

Furthermore, a P-type MOS transistor Q69 is connected between the sources of the transistors Q44, Q45 and a power supply voltage node (second reference voltage node). An enable signal En is input to a gate of the transistor Q69. The transistor Q69 performs the same operation as the transistor Q4 in FIG. 1.

A pull-up circuit (first voltage setting circuit) 26 is connected to the first output node n1 and the second output node n2. The pull-up circuit 26 pulls up the first output node n1 and the second output node n2 to a high level when the clock signal Clk is at a low level, that is, during a period in which the comparison circuit 22 does not perform a comparison operation. The pull-up circuit 26 includes a P-type MOS transistor Q47 connected to the first output node n1, and a P-type MOS transistor Q48 connected to the second output node n2. A clock signal Clk is input to gates of the transistors Q47, Q48.

A latch circuit 30 includes P-type MOS transistors Q57 to Q60, and N-type MOS transistors Q61 to Q66. The first output node n1 is connected to each gate of the transistors Q57, Q61, and Q62. The second output node n2 is connected to each gate of the transistors Q58, Q64, and Q65. Each gate of the transistors Q60 and Q66 and each drain of the transistors Q59, Q63 are connected to an output terminal TL5 that outputs a differential output voltage Vout_p of the comparator 1e. Each gate of the transistors Q59 and Q63 and each drain of the transistors Q65, Q66 are connected to an output terminal TL6 that outputs a differential output voltage Vout_n of the comparator 1e.

In the comparator 1e in FIG. 11, similar to the comparators 1 to 1d according to the first to fourth embodiments described above, the tail node in each comparison device is pulled up during a period in which the comparator 1e does not perform a comparison operation. Accordingly, the voltage dependence of the input parasitic capacitances Cin_p and Cin_n of the comparator 1e can be sufficiently reduced, so that deterioration of various characteristics such as distortion of the ADC 4b can be prevented.

Note that the present technology can have the following configurations.

(1) A comparator including: a first transistor and a second transistor that include two sources connected to each other, two gates to which a differential input signal pair are input, and two drains that output a differential output signal pair corresponding to a difference signal of the differential input signal pair;

a third transistor that is connected between both the sources of the first transistor and the second transistor and a first reference voltage node, the third transistor being switched on or off in accordance with logic of a first signal; and a fourth transistor that is connected between both the sources of the first transistor and the second transistor and a second reference voltage node, the fourth transistor being switched on or off in accordance with logic of a second signal having logic different from the logic of the first signal.

(2) The comparator described in (1), in which the fourth transistor is turned on in a period in which the first transistor and the second transistor do not perform a comparison operation of the difference signal of the differential input signal pair.

(3) The comparator described in (1) or (2), in which the third transistor is intermittently turned on during a period in which the fourth transistor is off.

(4) The comparator described in any one of (1) to (3), further including a latch circuit that holds the differential output signal pair.

(5) The comparator described in (4), further including a waveform shaping circuit that performs waveform shaping of the differential output signal pair output from both the drains of the first transistor and the second transistor, in which a signal after waveform shaping performed by the waveform shaping circuit is input to the latch circuit.

(6) The comparator described in (5), in which the waveform shaping circuit includes two inverters that invert logic of the differential output signal pair.

(7) The comparator described in any one of (4) to (6), further including a fifth transistor that switches whether or not to perform a holding operation by the latch circuit in accordance with the logic of the first signal,
  in which the fifth transistor is intermittently turned on during a period in which the fourth transistor is off.
(8) The comparator described in any one of (1) to (7), in which the fourth transistor has a conductivity type different from a conductivity type of the third transistor.
(9) The comparator described in any one of (1) to (8), in which the first transistor, the second transistor, and the third transistor include N-type MOS transistors, and
  the fourth transistor includes a P-type MOS transistor.
(10) The comparator described in any one of (1) to (8), in which the first transistor, the second transistor, and the third transistor include P-type MOS transistors, and
  the fourth transistor includes an N-type MOS transistor.
(11) The comparator described in any one of (1) to (10), further including:
  a first input terminal and a second input terminal to which a first differential input signal pair are input;
  a third input terminal and a fourth input terminal to which a second differential input signal pair are input; and
  a comparison circuit that outputs a signal corresponding to a difference signal of the first differential input signal pair input to the first input terminal and the second input terminal and a difference signal of the second differential input signal pair input to the third input terminal and the fourth input terminal,
  in which the comparison circuit includes:
  a first comparison device that includes sixth to ninth transistors having a same circuit configuration as a circuit configuration of the first to fourth transistors; and
  a second comparison device that includes tenth to thirteenth transistors having the same circuit configuration as the circuit configuration of the first to fourth transistors.
(12) An analog to digital converter including: a first sampling switch that switches whether or not to sample one signal of a differential input signal pair;
  a first digital to analog converter that converts the one signal sampled into a digital signal including a plurality of bits bit by bit in order, and outputs a signal having a voltage level corresponding to an unconverted bit;
  a second sampling switch that switches whether or not to sample another signal of the differential input signal pair;
  a second digital to analog converter that converts the another signal sampled into a digital signal including a plurality of bits bit by bit in order, and outputs a signal having a voltage level corresponding to an unconverted bit;
  a comparator that outputs a signal corresponding to a difference signal of a first differential input signal pair in which an output signal of the first digital to analog converter and an output signal of the second digital to analog converter form a pair; and
  a control circuit that controls the first digital to analog converter and the second digital to analog converter on the basis of an output signal of the comparator,
  in which the comparator includes:
  a first transistor and a second transistor that include two sources connected to each other, two gates to which the first differential input signal pair are input, and two drains that output a differential output signal pair corresponding to the difference signal of the first differential input signal pair;
  a third transistor that is connected between both the sources of the first transistor and the second transistor and a first reference voltage node, the third transistor being switched on or off in accordance with logic of a first signal; and
  a fourth transistor that is connected between both the sources of the first transistor and the second transistor and a second reference voltage node, the fourth transistor being switched on or off in accordance with logic of a second signal having logic different from the logic of the first signal.
(13) The analog to digital converter described in (12), further including a filter circuit that samples and outputs the output signal of the first digital to analog converter and the output signal of the second digital to analog converter,
  in which the comparator outputs a signal corresponding to the difference signal of the first differential input signal pair in which the output signal of the first digital to analog converter and the output signal of the second digital to analog converter form a pair and a difference signal of a second differential input signal pair output from the filter circuit,
  the comparator includes:
  a first input terminal and a second input terminal to which the first differential input signal pair are input;
  a third input terminal and a fourth input terminal to which the second differential input signal pair are input; and
  a comparison circuit that outputs a signal corresponding to the difference signal of the first differential input signal pair input to the first input terminal and the second input terminal and the difference signal of the second differential input signal pair input to the third input terminal and the fourth input terminal, and
  the comparison circuit includes the first to fourth transistors.

Aspects of the present disclosure are not limited to individual embodiments described above, but include various modifications that can be conceived by those skilled in the art, and advantageous effects of the present disclosure are not limited to the contents described above. That is, various additions, modifications, and partial deletions can be made without departing from the conceptual idea and spirit of the present disclosure derived from the contents defined in claims and equivalents thereof.

REFERENCE SIGNS LIST 1, 1a, 1b, 1c, 1d, 1e Comparator
2 Pull-up circuit
3 Latch circuit
4, 4a, 4b ADC
5 First sampling switch
6 Second sampling switch
7 First DAC
8 Second DAC
9a, 9b Inverter
10 Control circuit
11 AND gate
12 NOR gate
13 AND gate
14 Inverter
20 Capacitive DAC
21 Filter circuit
22 Comparison circuit
30 Latch circuit

The invention claimed is:

1. A comparator, comprising:
    a first transistor that comprises a first source, a first gate, and a first drain;
    a second transistor that comprises a second source, a second gate, and a second drain, wherein
        the first source is connected to the second source,
        the first gate is configured to receive a first differential input signal pair,
        the second gate is configured to receive the first differential input signal pair,
        the first drain is configured to output a differential output signal pair,
        the second drain is configured to output the differential output signal pair,
        the differential output signal pair corresponds to a first difference signal, and
        the first difference signal is associated with the first differential input signal pair;
    a third transistor that is connected between the first source, the second source, and a first reference voltage node, wherein the third transistor is switched on or switched off based on a first logic of a first signal; and
    a fourth transistor connected between the first source, the second source, and a second reference voltage node, wherein
        the fourth transistor is switched on or switched off based on a second logic of a second signal, and
        the second logic is different from the first logic.

2. The comparator according to claim 1, wherein
    the fourth transistor is switched on in a period in which the first transistor and the second transistor do not perform a comparison operation, and
    the comparison operation is associated with the first difference signal.

3. The comparator according to claim 1, wherein the third transistor is intermittently switched on during a period in which the fourth transistor is switched off.

4. The comparator according to claim 1, further comprising a latch circuit configured to hold the differential output signal pair.

5. The comparator according to claim 4, further comprising a waveform shaping circuit configured to perform waveform shaping of the differential output signal pair, wherein
    a third signal is based on the waveform shaping, and
    the latch circuit is configured to receive the third signal.

6. The comparator according to claim 5, wherein
    the waveform shaping circuit includes two inverters,
    the two inverters are configured to invert a third logic, and
    the third logic is associated with the differential output signal pair.

7. The comparator according to claim 4, further comprising a fifth transistor configured to control the latch circuit, wherein
    the latch circuit is configured to perform a holding operation based on the first logic of the first signal, and
    the fifth transistor is intermittently switched on based on the fourth transistor being switched off.

8. The comparator according to claim 1, wherein a conductivity type of the fourth transistor is different from a conductivity type of the third transistor.

9. The comparator according to claim 1, wherein
    each of the first transistor, the second transistor, and the third transistor includes an N-type MOS transistor, and
    the fourth transistor includes a P-type MOS transistor.

10. The comparator according to claim 1, wherein
    each of the first transistor, the second transistor, and the third transistor includes a P-type MOS transistor, and
    the fourth transistor includes an N-type MOS transistor.

11. The comparator according to claim 1, further comprising:
    a first input terminal configured to receive the first differential input signal pair;
    a second input terminal configured to receive the first differential input signal pair;
    a third input terminal configured to receive a second differential input signal pair;
    a fourth input terminal configured to receive the second differential input signal pair; and
    a comparison circuit configured to output a third signal corresponding to the first difference signal and a second difference signal, wherein
        the first input terminal is configured to receive the first difference signal,
        the second input terminal is configured to receive the first difference signal,
        the second difference signal is associated with the second differential input signal pair,
        the third input terminal is configured to receive the second difference signal,
        the fourth input terminal is configured to receive the second difference signal,
        the comparison circuit includes:
            a first comparison device that includes a sixth transistor, a seventh transistor, an eight transistor, and a ninth transistor; and
            a second comparison device that includes a tenth transistor, an eleventh transistor, a twelfth transistor, and a thirteenth transistor,
        the sixth transistor, the seventh transistor, the eight transistor, and the ninth transistor have a same circuit configuration as a circuit configuration of the first transistor, the second transistor, the third transistor, and the fourth transistor, and
        the tenth transistor, the eleventh transistor, the twelfth transistor, and the thirteenth transistor have the same circuit configuration as the circuit configuration of the first transistor, the second transistor, the third transistor, and the fourth transistor.

12. An analog to digital converter, comprising:
    a first sampling switch configured to sample a first signal associated with a first differential input signal pair;
    a first digital to analog converter configured to:
        convert the first signal sampled into a first digital signal; and
        output a first output signal, wherein
            the first output signal has a first voltage level corresponding to a first unconverted bit, and
            the first digital signal includes a first plurality of bits in a bit by bit order;
    a second sampling switch configured to sample a second signal of the first differential input signal pair;
    a second digital to analog converter configured to:
        convert the second signal sampled into a second digital signal; and
        output a second output signal, wherein
            the second output signal has a second voltage level corresponding to a second unconverted bit, and
            the second digital signal includes a second plurality of bits in the bit by bit order;

a comparator configured to output a third signal corresponding to a first difference signal, wherein
the first difference signal is associated with the first differential input signal pair, and
the first output signal and the second output signal form a pair; and
a control circuit configured to control the first digital to analog converter and the second digital to analog converter based on a third output signal of the comparator,
wherein the comparator includes:
a first transistor that comprises a first source, a first gate, and a first drain;
a second transistor that comprises a second source, a second gate, and a second drain, wherein
the first source is connected to the second source,
the first gate is configured to receive the first differential input signal pair,
the second gate is configured to receive the first differential input signal pair,
the first drain is configured to output a differential output signal pair,
the second drain is configured to output the differential output signal pair,
the differential output signal pair corresponds to the first difference signal, and
the first difference signal is associated with the first differential input signal pair;
a third transistor that is connected between the first source, the second source, and a first reference voltage node, wherein the third transistor is switched on or switched off based on a first logic of the first signal; and
a fourth transistor that is connected between the first source, the second source, and a second reference voltage node, wherein
the fourth transistor is switched on or switched off based on a second logic of a second signal, and
the second logic is different from the first logic.

13. The analog to digital converter according to claim 12, further comprising a filter circuit configured to:
sample the first output signal and the second output signal; and
output the first output signal, the second output signal, and a second differential input signal pair, wherein
the comparator is further configured to output a third signal corresponding to the first difference signal and a second difference signal,
the second difference signal corresponds to the second differential input signal pair,
the comparator further includes:
a first input terminal configured to receive the first differential input signal pair;
a second input terminal configured to receive the first differential input signal pair;
a third input terminal configured to receive the second differential input signal pair;
a fourth input terminal configured to receive the second differential input signal pair; and
a comparison circuit configured to output a fourth signal corresponding to the first difference signal and the second difference signal,
the first input terminal is configured to receive the first difference signal,
the second input terminal is configured to receive the first difference signal,
the third input terminal is configured to receive the second difference signal,
the fourth input terminal is configured to receive the second difference signal, and
the comparison circuit includes the first transistor, the second transistor, the third transistor, and the fourth transistor.

\* \* \* \* \*